(12) United States Patent
Lee

(10) Patent No.: US 12,308,324 B2
(45) Date of Patent: May 20, 2025

(54) OVERLAY MARK

(71) Applicant: Winbond Electronics Corp., Taichung (TW)

(72) Inventor: Kuang-Chung Lee, Taichung (TW)

(73) Assignee: Winbond Electronics Corp., Taichung (TW)

( * ) Notice: Subject to any disclaimer, the term of this patent is extended or adjusted under 35 U.S.C. 154(b) by 518 days.

(21) Appl. No.: 17/749,140

(22) Filed: May 20, 2022

(65) Prior Publication Data

US 2023/0378082 A1     Nov. 23, 2023

(51) Int. Cl.
*H01L 23/544*     (2006.01)
*G03F 1/42*     (2012.01)

(52) U.S. Cl.
CPC .............. *H01L 23/544* (2013.01); *G03F 1/42* (2013.01); *H01L 2223/54426* (2013.01)

(58) Field of Classification Search
CPC H01L 23/544; H01L 2223/54426; G03F 1/42
See application file for complete search history.

(56) References Cited

U.S. PATENT DOCUMENTS

| | | | |
|---|---|---|---|
| 7,485,543 B2* | 2/2009 | Han | H01L 21/76224 257/E21.546 |
| 11,037,882 B2 | 6/2021 | Chen et al. | |
| 2014/0264461 A1* | 9/2014 | Xu | H01L 21/76895 438/129 |
| 2018/0284624 A1* | 10/2018 | Ausschnitt | G01B 11/24 |
| 2019/0064654 A1* | 2/2019 | Lee | G03F 1/22 |
| 2019/0378800 A1* | 12/2019 | Chen | G03F 7/70683 |
| 2023/0064001 A1* | 3/2023 | Chien | H01L 22/12 |

FOREIGN PATENT DOCUMENTS

| | | |
|---|---|---|
| CN | 108695184 | 10/2018 |
| TW | 201921574 | 6/2019 |

OTHER PUBLICATIONS

"Office Action of Taiwan Counterpart Application", issued on May 9, 2023, p. 1-p. 6.

* cited by examiner

*Primary Examiner* — Michael M Trinh
(74) *Attorney, Agent, or Firm* — JCIPRNET

(57) ABSTRACT

Provided is an overlay mark including a first pattern and a second pattern. The first pattern includes a plurality of first strip shapes and a plurality of first dot shapes. The plurality of first strip shapes extend along a first direction and are arranged in parallel along a second direction. The plurality of first dot shapes are respectively disposed between the plurality of first strip shapes. The second pattern includes a plurality of second strip shapes and a plurality of second dot shapes. The plurality of second strip shapes extend along the second direction and are arranged in parallel along the first direction. The plurality of second dot shapes are respectively disposed between the plurality of second strip shapes.

11 Claims, 4 Drawing Sheets

OVERLAY MARK

BACKGROUND OF THE INVENTION

Field of the Invention

The present invention relates to an overlay mark for forming an active area pattern.

Description of Related Art

In the semiconductor process, a photolithography process is an important step in transferring an integrated circuit layout to a semiconductor wafer. Generally, in the semiconductor process, the circuit layout provided by the integrated circuit (IC) design house has to first be divided into multi-layered design layouts, and are respectively fabricated on the corresponding photomasks to form photomask layouts. The pattern of each photomask layout can be transferred into the photoresist layer on the semiconductor wafer through the photolithography process, and through the corresponding etching, deposition, doping and other processes to obtain the desired semiconductor devices.

As the integration of the integrated circuits continues to increase, more and more attention has been paid to the measurement of the overlay between the photomask layouts. For example, in order to form the active area of the memory device, two different photolithography processes of forming the active strip pattern and cutting the active strip pattern are generally used. In order to precisely align the isolation structure of cutting the active strip pattern at a predetermined position, the overlay step between the active strip pattern and the isolation structure has to be performed during the photolithography process.

However, the current active strip pattern is an oblique extending direction between the X direction and the Y direction. Therefore, it is impossible to directly know the offset of the overlay shift between the active strip pattern and the isolation structure just by measuring the etched active area pattern in the die and further adjust the process parameters.

SUMMARY OF THE INVENTION

The invention provides an overlay mark which can accurately measure the offset of the overlay shift between the active strip pattern and the isolation structure to adjust the process parameters, thereby improving the process yield and reducing the manufacturing cost.

The invention provides an overlay mark including a first pattern and a second pattern. The first pattern includes a plurality of first strip shapes and a plurality of first dot shapes. The plurality of first strip shapes extend along a first direction and are arranged in parallel along a second direction. The plurality of first dot shapes are respectively disposed between the plurality of first strip shapes. The second pattern includes a plurality of second strip shapes and a plurality of second dot shapes. The plurality of second strip shapes extend along the second direction and are arranged in parallel along the first direction. The plurality of second dot shapes are respectively disposed between the plurality of second strip shapes.

DESCRIPTION OF THE EMBODIMENTS

Figure 1:
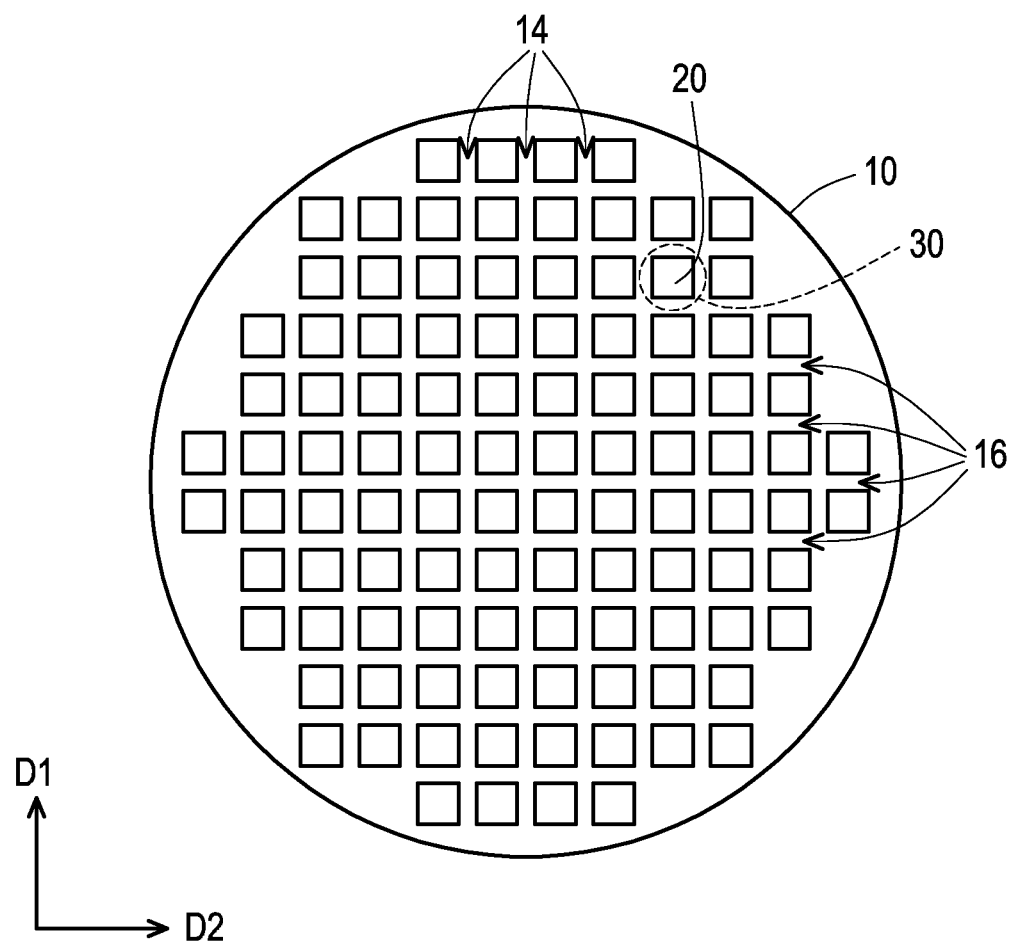
FIG. 1 is a schematic top view of a wafer with an overlay mark according to an embodiment of the present invention.
Figure 2:
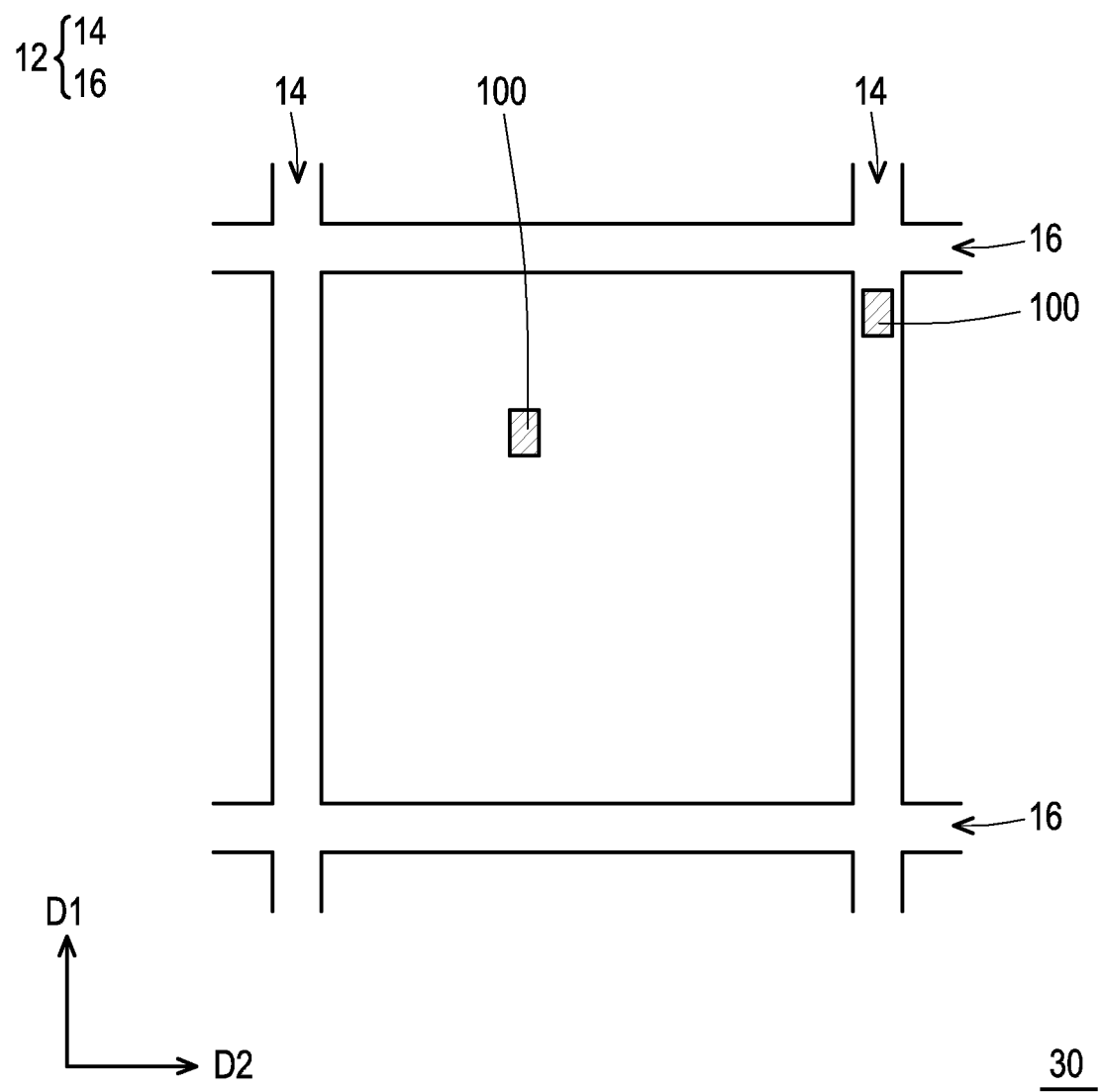
FIG. 2 is an enlarged schematic view of a region of FIG. 1.

FIG. 1 is a schematic top view of a wafer 10 with an overlay mark according to an embodiment of the present invention. FIG. 2 is an enlarged schematic view of a region 30 of FIG. 1. The overlay mark illustrated in the following embodiment is used to form an active area pattern in a substrate of a memory device. The memory device may be dynamic random access memory (DRAM), but the present invention is not limited thereto.

Referring to FIG. 1 and FIG. 2, the present embodiment provides the wafer 10 with an overlay mark 100. Specifically, the wafer 10 may include a semiconductor wafer, such as a silicon wafer. The wafer 10 may be divided into a plurality of dies 20 by a plurality of scribe lines 12. In one embodiment, the scribe lines 12 may include a plurality of first scribe lines 14 and a plurality of second scribe lines 16. The first scribe lines 14 may extend along a first direction D1 and may be arranged in parallel along a second direction D2. The second scribe lines 16 may extend along the second direction D2 and may be arranged in parallel along the first direction D1. The first direction D1 may be substantially perpendicular to the second direction D2. In this case, the die 20 may be arranged in an array with a plurality of rows and a plurality of columns, as shown in FIG. 1.

As shown in FIG. 2, the overlay marks 100 may be disposed on the scribe lines 12 or inside each die 20 to measure the overlay of the current layer (e.g., the opening in the photoresist layer) and the previous layer during the manufacturing process. At present, the active area pattern of the memory device is achieved by two different photolithography processes of forming the active strip pattern and cutting the active strip pattern. In the process of forming the isolation structure to cut the active strip pattern and forming a plurality of active areas in the substrate, the center of gravity (COG) of the isolation structure is aligned with the center of gravity of the active strip pattern to completely cut the active strip pattern, thereby forming the plurality of active areas separated from each other. That is, the isolation structure may physically separate or electrically separate the active areas from each other, so as to avoid the electrical interference issue between adjacent active areas. Next, the degree of the center of gravity shift between the active strip pattern and the isolation structure may be known by measuring the active area pattern in the die, thereby adjusting the process parameters. However, the current measurement method can only know the shift of the center of gravity between the active strip pattern and the isolation structure, but cannot recognize the offset of the shift in the X direction (i.e., the second direction D2) and/or the Y direction (i.e., the first direction D1). Therefore, the current measurement method cannot further adjust the process parameters, so as to achieve the purpose of improving the process yield.

Figure 4:
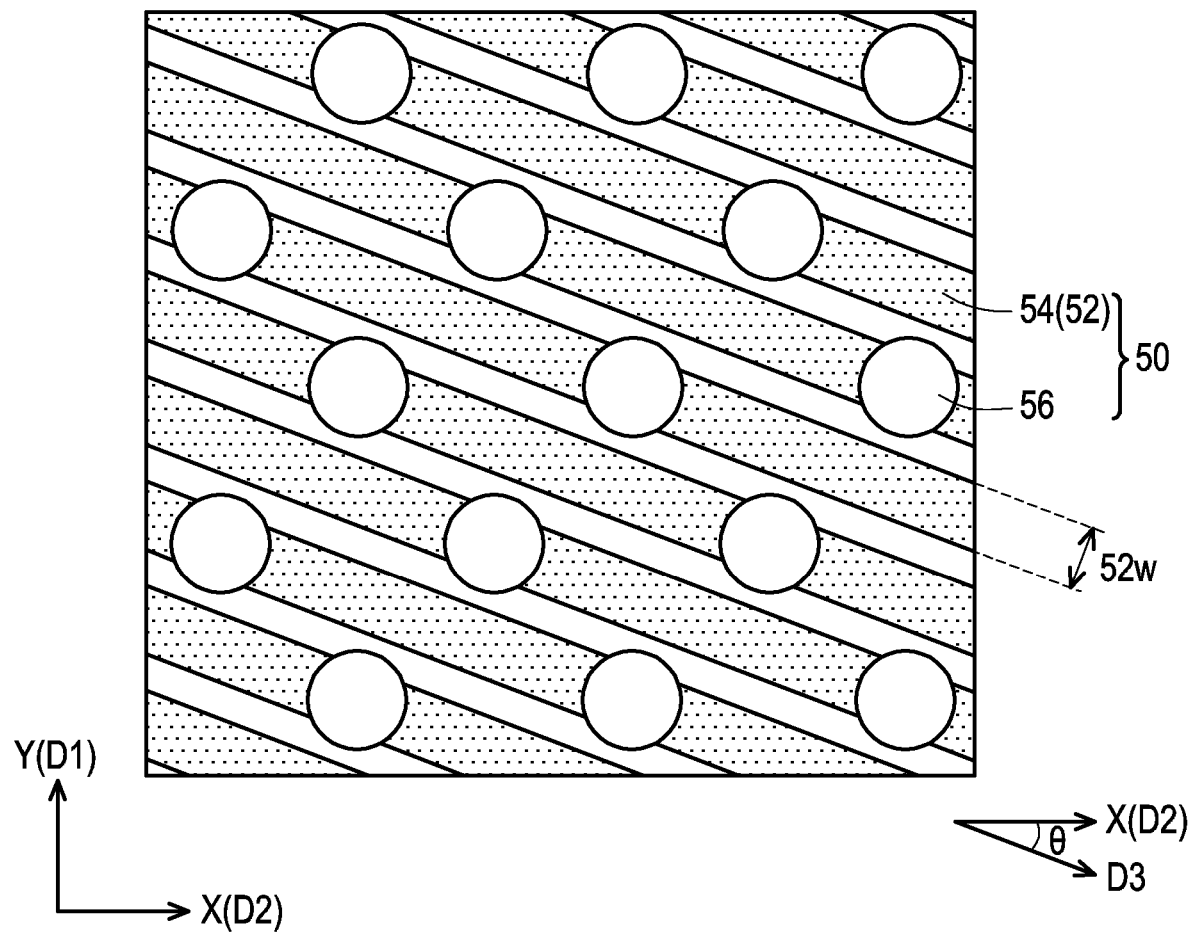
FIG. 4 is a schematic top view of an active area pattern according to an embodiment of the present invention.

On the other hand, similar to the arrangement in FIG. 4, the current active strip pattern 52 extends along an oblique extending direction D3 between the X direction and the Y direction (for example, the angle $\theta$ between the oblique extending direction and the X direction may be 21.04 degrees). In this case, when the center of gravity of the isolation structure 56 may shift along the oblique extending direction D3, it cannot know the shift of the center of gravity between the active strip pattern 52 and the isolation structure 56 by using the current measurement method, which leads to the cutting of a portion of the active strip pattern 52 is incomplete, so that the electrical interference occurs between adjacent active areas 54.

Figure 3:
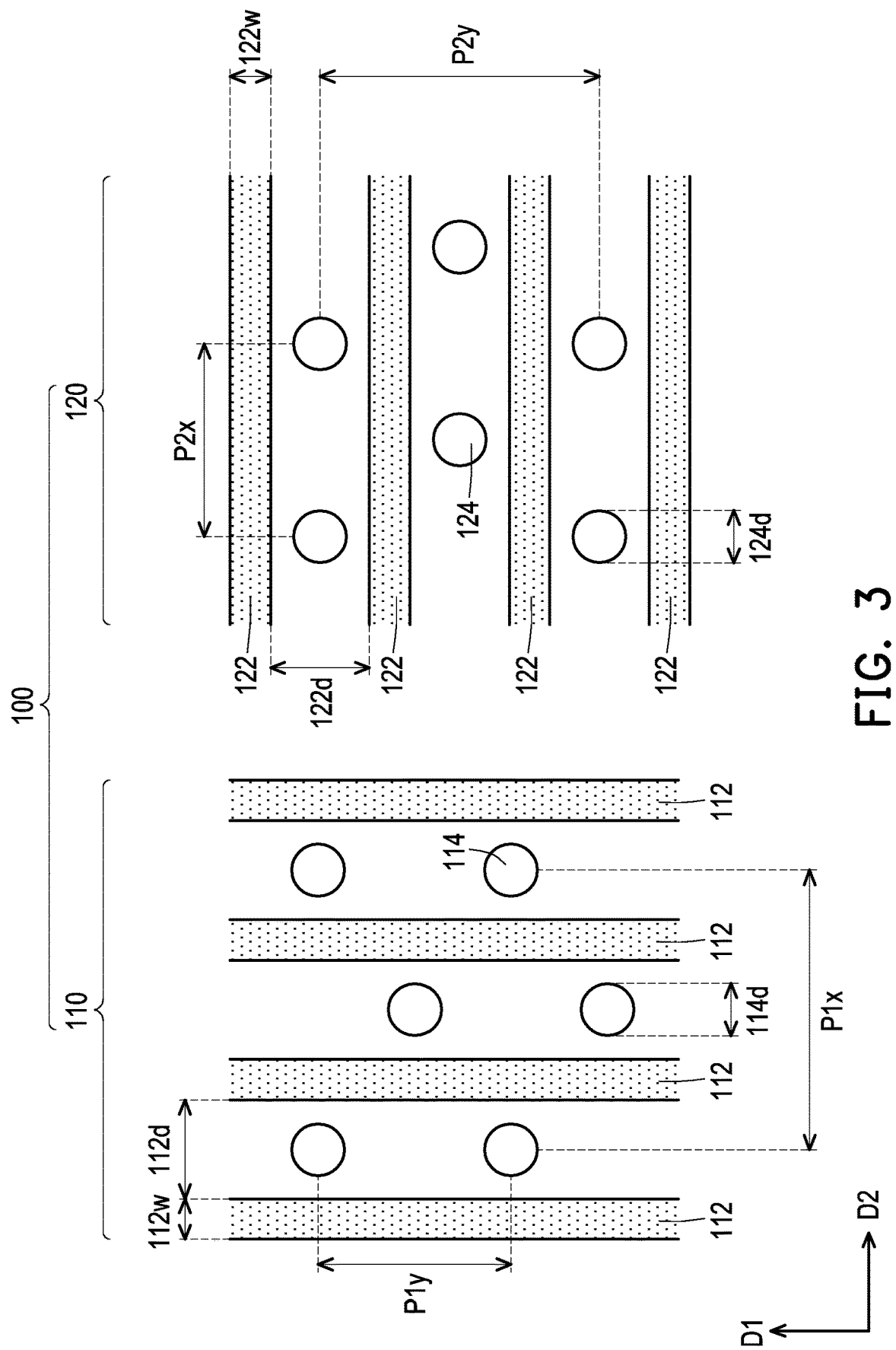
FIG. 3 is a schematic top view of an overlay mark for forming an active area pattern according to an embodiment of the present invention.

In order to solve the above-mentioned issue of the prior art, an embodiment of the present invention provides an overlay mark for forming an active area pattern. As shown in FIG. 3, the overlay mark 100 includes a first pattern 110 and a second pattern 120. The first pattern 110 includes: a plurality of first strip shapes 112 and a plurality of first dot shapes 114. In one embodiment, the first strip shapes 112 may extend along the first direction D1 and be arranged in parallel along the second direction D2. From another perspective, the extending direction of the first strip shapes 112 may be parallel to the extending direction of the first scribe lines 14 of FIG. 1 and perpendicular to the extending direction of the second scribe lines 16 of FIG. 1. In one embodiment, a width 112w of the first strip shapes 112 in the second direction D2 may be between 18 nm and 22 nm, for example, 20 nm. A distance 112d between adjacent first strip shapes 112 may be the same or different. In one embodiment, the distance 112d between adjacent first strip shapes 112 may be greater than or equal to 120 nm, for example, between 120 nm and 140 nm. A ratio between the distance 112d and the width 112w (i.e., 112d/112w) may be between 5.5 and 7.8.

The first dot shapes 114 may be respectively disposed between the first strip shapes 112, and arranged staggered with each other. In one embodiment, a diameter 114d of the first dot shapes 114 may be between 50 nm and 70 nm, for example, 60 nm. A pitch P1y of the first dot shapes 114 in the first direction D1 is greater than or equal to 120 nm, for example, between 120 nm and 140 nm; and a pitch P1x of the first dot shapes 114 in the second direction D2 is greater than or equal to 240 nm, for example, between 240 nm and 280 nm. There are two first strip shapes 112 and another first dot shape 114 within the pitch P1x between the two first dot shapes 114. That is, the pitch P1x is referred to the distance of the centers of the two first dot shapes 114 between two odd columns or two even columns. A ratio between the pitch P1x and the diameter 114d (i.e., P1x/114d) may be between 3.4 and 5.6; a ratio between the pitch P1y and the diameter 114d (i.e., P1y/114d) may be between 1.7 and 2.8; and a ratio between the pitch P1x and the width 112w (i.e., P1x/112w) may be between 10.9 and 15.6.

It should be noted that, in the present embodiment, the first strip shapes 112 corresponding to a plurality of active strips may be adjusted to extend along the first direction D1 (e.g., Y direction) and the first dot shapes 114 corresponding to a plurality of isolation structures may be disposed between the first strip shapes 112, so as to measure the offset of the center of gravity shift between the active strips and the isolation structures in the second direction D2 (e.g., X direction), thereby adjusting the process parameters in the second direction D2. In some embodiments, the first dot shapes 114 should be disposed at the exact center of the distance 112d between the adjacent first strip shapes 112 to ensure that no shift between the active strip and isolation structure in the second direction D2 (e.g., X direction) under the ideal condition. That is, if the first dot shapes 114 in the overlay mark 100 is measured to shift from the exact center of the distance 112d which means that the active strip and the isolation structure have the center of gravity shift in the second direction D2 (e.g., X direction), and it is necessary to rework or adjust the process parameters in the second direction D2.

Similarly, the second pattern 120 includes a plurality of second strip shapes 122 and a plurality of second dot shapes 124. The second strip shapes 122 extend along the second direction D2 and are arranged in parallel along the first direction D1. From another perspective, an extending direction of the second strip shapes 122 may be parallel to the extending direction of the second scribe lines 16 of FIG. 1 and perpendicular to the extending direction of the first scribe lines 14 of FIG. 1. In one embodiment, a width 122w of the second strip shapes 122 in the first direction D1 may be between 18 nm and 22 nm, for example, 20 nm. A distance 122d between adjacent second strip shapes 122 may be the same or different. In one embodiment, the distance 122d between the adjacent second strip shapes 122 may be greater than or equal to 120 nm, for example, between 120 nm and 140 nm. A ratio between the distance 122d and the width 122w (i.e., 122d/122w) may be between 5.5 and 7.8.

The second dot shapes 124 may be respectively disposed between the second strip shapes 122, and arranged staggered with each other. In one embodiment, a diameter 124d of the second dot shapes 124 may be between 50 nm and 70 nm, for example, 60 nm. A pitch P2y of the second dot shapes 124 in the first direction D1 is greater than or equal to 240 nm, for example, between 240 nm and 280 nm. There are two second strip shapes 122 and another second dot shape 124 within the pitch P2y between the two second dot shapes 124. That is, the pitch P2y is referred to the distance of the centers of the two second dot shapes 124 between two odd rows or two even rows; and the pitch P2x of the second dot shapes 124 in the second direction D2 is greater than or equal to 120 nm, for example, between 120 nm and 140 nm. A ratio between the pitch P2x and the diameter 124d (i.e., P2x/124d) may be between 1.7 and 2.8; a ratio between the pitch P2y and the diameter 124d (i.e., P2y/124d) may be between 3.4 and 5.6; and a ratio between the pitch P2y and the width 122w (i.e., P2y/122w) may be between 10.9 and 15.6.

It should be noted that, in the present embodiment, the second strip shapes 122 corresponding to a plurality of active strips may be adjusted to extend along the second direction D2 (e.g., X direction) and the second dot shapes 124 corresponding to a plurality of isolation structures may be disposed between the second strip shapes 122, so as to measure the offset of the center of gravity shift between the active strips and the isolation structures in the first direction D1 (e.g., Y direction), thereby adjusting the process parameters in the first direction D1. In some embodiments, the second dot shapes 124 should be disposed at the exact center of the distance 122d between adjacent second strip shapes 122 to ensure that no shift between the active strip and isolation structure in the first direction D1 (e.g., Y direction) under the ideal condition. That is, if the second dot shapes 124 in the overlay mark 100 is measured to shift from the exact center of the distance 122d which means that the active strip and the isolation structure have the center of gravity shift in the first direction D1 (e.g., Y direction), and it is necessary to rework or adjust the process parameters in the first direction D1.

In addition, the first strip shapes 112 and the second strip shapes 122 may correspond to a plurality of active strips in the substrate (e.g., as shown by reference number 52 in FIG. 4), while the first dot shapes 114 and the second dot shapes 124 may correspond to a plurality of isolation structures of cutting the active strips (e.g., as shown by reference number 56 in FIG. 4). That is, the first pattern 110 and the second pattern 120 may be located in the same film layer, for example, the active area pattern layer in the substrate (e.g., as shown by reference number 50 in FIG. 4).

As technology nodes are gradually shrinking, the photolithography process adopted for forming the active strips 52 with the oblique extending direction (e.g., as shown by reference number D3 in FIG. 4) in the device region cannot develop the first pattern 110 and the second pattern 120 within the overlay mark 100 in the same node. The oblique extending direction D3 may be between the first direction D1 and the second direction D2. Therefore, the present embodiment may increase the pitch P1x of the first dot shapes 114 in the second direction D2 to be greater than or equal to 240 nm and increase the pitch P2y of the second dot shapes 124 in the first direction D1 to be greater than or equal to 240 nm, so as to ensure the pattern resolution of the first pattern 110 and the second pattern 120 (which is also called pattern healthy). On the other hand, in order to ensure that the measurement quantity of the overlay mark 100 is large enough to accurately monitor the process variation, in the present embodiment, the pitch P1x may be controlled to be between 240 nm and 280 nm, and the pitch P2y may be controlled to be between 240 nm and 280 nm. In this case, the present embodiment can measure more data of the offset of the overlay shift while having the pattern health of the overlay mark 100, thereby achieving the purpose of improving the process yield and reducing the manufacturing cost.

In one embodiment, a width 52w of the active strips 52 in the device region may be between 18 nm and 22 nm, for example, 20 nm. A ratio between the width 112w and the width 52w in the overlay mark 100 (i.e., 112w/52w) may be between 0.9 and 1.1; and a ratio between the width 122w and the width 52w in the overlay mark 100 (i.e., 122w/52w) may be between 0.9 and 1.1.

To sum up, in the embodiment of the present invention, the first strip shapes corresponding to a plurality of active strips of the overlay mark may be adjusted to extend along the Y direction, and the first dot shapes corresponding to a plurality of isolation structures may be disposed between the first strip shapes, so as to measure the offset of the center of gravity shift between the active strips and the isolation structures in the X direction, thereby adjusting the process parameters in the X direction. In addition, in the embodiment of the present invention, the second strip shapes corresponding to the plurality of active strips of the overlay mark may also be adjusted to extend along the X direction and the second dot shapes corresponding to the plurality of isolation structures are disposed between the second strip shapes, so as measure the offset of the center of gravity shift between the active strips and the isolation structures in the Y direction, thereby adjusting the process parameters in the Y direction. Further, in the embodiment of the present invention, the pitches of the first dot shapes and the second dot shapes may be increased to ensure the pattern health of the first pattern and the second pattern. Therefore, the embodiment of the present invention can measure more data of the offset of the overlay shift while having the pattern health of the overlay mark, thereby achieving the purpose of improving the process yield and reducing the manufacturing cost.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An overlay mark, comprising:
a first pattern comprising:
a plurality of first strip shapes extending along a first direction and arranged in parallel along a second direction; and
a plurality of first dot shapes respectively disposed between the plurality of first strip shapes; and
a second pattern comprising:
a plurality of second strip shapes extending along the second direction and arranged in parallel along the first direction; and
a plurality of second dot shapes respectively disposed between the plurality of second strip shapes,
wherein all of the first dot shapes between two adjacent first strip shapes are arranged in a column along the first direction, all of the second dot shapes between two adjacent second strip shapes are arranged in a row along the second direction, the first dot shapes in two adjacent columns are staggered with each other, and the second dot shapes in two adjacent rows are staggered with each other.

2. The overlay mark according to claim 1, wherein a pitch of the plurality of first dot shapes in the first direction is greater than or equal to 120 nm.

3. The overlay mark according to claim 1, wherein a pitch of the plurality of first dot shapes in the second direction is greater than or equal to 240 nm.

4. The overlay mark according to claim 1, wherein a pitch of the plurality of second dot shapes in the first direction is greater than or equal to 240 nm.

5. The overlay mark according to claim 1, wherein a pitch of the plurality of second dot shapes in the second direction is greater than or equal to 120 nm.

6. The overlay mark according to claim 1, wherein the plurality of first strip shapes have an extending direction parallel to an extending direction of a first scribe line and perpendicular to an extending direction of a second scribe line.

7. The overlay mark according to claim 1, wherein the plurality of second strip shapes have an extending direction perpendicular to an extending direction of a first scribe line and parallel to an extending direction of a second scribe line.

8. The overlay mark according to claim 1, wherein the first pattern and the second pattern are in the same film layer.

9. The overlay mark according to claim 1, wherein the plurality of first strip shapes and the plurality of second strip shapes correspond to a plurality of active strips in a substrate.

10. The overlay mark according to claim 9, wherein the plurality of first dot shapes and the plurality of second dot shapes correspond to a plurality of isolation structures cutting the plurality of active strips.

11. The overlay mark according to claim 9, wherein an extending direction of the plurality of active strips is between an extending direction of the plurality of first strip shapes and an extending direction of the plurality of second strip shapes.

* * * * *